(12) United States Patent
Xu

(10) Patent No.: US 7,589,548 B2
(45) Date of Patent: Sep. 15, 2009

(54) DESIGN-FOR-TEST MICRO PROBE

(75) Inventor: Fang Xu, Auburndale, MA (US)

(73) Assignee: Teradyne, Inc., North Reading, MA (US)

( * ) Notice: Subject to any disclaimer, the term of this patent is extended or adjusted under 35 U.S.C. 154(b) by 91 days.

(21) Appl. No.: 11/677,616

(22) Filed: Feb. 22, 2007

(65) Prior Publication Data
US 2008/0205172 A1 Aug. 28, 2008

(51) Int. Cl.
G01R 31/28 (2006.01)
(52) U.S. Cl. ...................................... 324/765
(58) Field of Classification Search ................. None
See application file for complete search history.

(56) References Cited

U.S. PATENT DOCUMENTS

| 3,612,999 | A | * | 10/1971 | Bergero | 324/76.41 |
| 4,509,008 | A | * | 4/1985 | DasGupta et al. | 714/731 |
| 6,798,225 | B2 | * | 9/2004 | Miller | 324/754 |
| 7,181,663 | B2 | * | 2/2007 | Hildebrant | 714/726 |
| 7,274,203 | B2 | * | 9/2007 | Tumin et al. | 324/765 |
| 2003/0033559 | A1 | * | 2/2003 | Williams | 714/39 |
| 2005/0191770 | A1 | | 9/2005 | Schieck et al. | |
| 2006/0242499 | A1 | * | 10/2006 | Volz | 714/724 |

FOREIGN PATENT DOCUMENTS

EP 1 569 005 8/2005

OTHER PUBLICATIONS

Hagge, J. et al., "High-Yield Assembly of Multichip Modules Through Known-Good ICs and Effective Test Strategies", Proc. of the IEEE, vol. 80(12), pp. 1973-1990 (1992).
International Search Report and Written Opinion in Application No. PCT/US2008/054384, dated Jul. 2, 2008.

* cited by examiner

Primary Examiner—Vinh P Nguyen
(74) Attorney, Agent, or Firm—Fish & Richardson P.C.

(57) ABSTRACT

Systems and techniques for testing a device having first and second interconnected chips that are internal to the device include selecting a site on a communication pathway along which an internal signal travels inside the device between the first and second chips, and connecting a test probe to the site.

11 Claims, 4 Drawing Sheets ic circuits.

DESIGN-FOR-TEST MICRO PROBE

TECHNICAL FIELD

This application relates to automatic test equipment, and more particularly to devices for measuring signals from integrated circuits.

BACKGROUND

In a process referred to as "packaging", the components of an integrated circuit (IC) are assembled into a package and the final packaged IC is tested to verify its functionality. During packaging, dies (i.e., integrated circuit chips cut from finished wafers) are often attached to a substrate or support structure, such as a printed circuit board, and encapsulated with a packaging material, such as epoxy or plastic. Dies may be assembled in different arrangements depending on the application and specification of a design, among other factors.

A flip chip, for example, is a type of assembly in which dies are mounted to a flexible circuit board that is folded or "flipped" to form a three-dimensional package. Some flip chip assemblies have solder bumps on an active surface that provide electrical connection to a circuit board when the chip is turned upside down. Flip chips then normally undergo an encapsulation process which covers the surface of the chip with a protective material. A flip chip package, like other kinds of IC packages, typically includes input pins for receiving external signals and output pins for transmitting signals generated by the IC.

SUMMARY

This application describes systems and methods, including computer program products, for testing a device (e.g., a packaged integrated circuit).

In general, in one aspect, the application describes automatic test equipment for testing a device under test having first and second interconnected chips that are internal to the device under test. The automatic test equipment includes a test probe; and a testing device communicatively coupled to the device under test. The testing device includes circuitry to exchange signals with the device under test, the signals comprising an internal signal acquired by the test probe attached to a communication pathway between the first and second chips, the internal signal traveling inside the device under test along the communication pathway and being inaccessible from an external pin on the device. The test probe includes a first conductive portion connected to the communication pathway; a second conductive portion attached to the testing device; and a resistive component coupled to the first and second conductive portions. The resistive component has an impedance to (1) substantially isolate a load of the testing device from the device during testing, the bad being communicatively coupled to the test probe; and (2) substantially isolate signals propagating through the second conductive portion of the test probe.

In general, in another aspect, the application also describes a method and a computer program product for testing a device having first and second interconnected chips that are internal to the device. The method includes selecting a she on a communication pathway along which an internal signal travels inside the device between the first and second chips; and connecting a test probe to the site. The test probe has an impedance to (1) substantially isolate a load of a test instrument from the device during testing, the load being communicatively coupled to the test probe; and (2) substantially isolate signals propagating through conductive portions of the test probe from the device during normal operation.

In general, in a further aspect, the application also describes a packaged integrated circuit that includes first and second chips having external pins that are accessible from outside the packaged integrated circuit; an electrical connection between the first and second chips, the electrical connection providing a pathway along which an internal signal propagates between the first chip and the second chip, the internal signal being inaccessible from an external pin on the first and second chips; and a probe configured to measure the internal signal. The probe includes a first conductive portion connected to the pathway; a second conductive portion configured to be attached to testing equipment; and a resistive component coupled to the first and second conductive portions. The resistive component has an impedance to (1) substantially isolate a load of the testing equipment from the electrical connection during testing, the load being communicatively coupled to the test probe; and (2) substantially isolate signals propagating through the second conductive portion of the test probe.

Embodiments may include one or more of the following. The internal signal may be inaccessible from external pins of the device. The selection of a site may be performed during a design phase of the device. The impedance of the test probe may be greater than 100 ohms. The test probe may be soldered to the site during manufacture of the device. One of the conductive portions of the test probe may be attached to automatic testing equipment. A test signal may he delivered to the device at the site using the probe.

The resistive component may include a resistor and/or a transistor-implemented buffer. The test probe may be integrated with an internal component of the device under test (e.g., one of the first and second chips). The second conductive portion of the test probe may be configured to receive a test signal from the testing equipment; and deliver the test signal to one or both of the first and second chips. The first and second chips may be attached to a flexible printed circuit board.

The automatic test equipment may include circuitry to analyze signals received from the test probe. The automatic test equipment may include a contact configured to be electrically coupled to one of the first and second conductive portions of the test probe. Circuitry for delivering a test signal to the device at the site using the test probe and for receiving the internal signal from the test probe may be included in the automatic test equipment.

One or more embodiments may provide one or more of the following advantages. The signals at internal sites of a device under test (e.g., a packaged IC chip) can be monitored without affecting the integrity of the signals. Access is provided to internal components of a packaged chip that are not accessible from external pins. A packaged chip is more effectively vended and debugged. The load of the test instrument is isolated from the device during testing, and the test pin and signals produced thereon are isolated from the device during normal operation. Using a probe, test signals can be delivered to internal sites of a packaged chip that are inaccessible from the external pins of the device.

The details of one or more embodiments are set forth, in the accompanying drawings and the description below. Other features, objects, and advantages will be apparent from the description and drawings, and from the claims.

DETAILED DESCRIPTION

The application is directed to semiconductor device testing that uses a test probe (referred to as a "design-for-test (DFT) probe") for measuring signals that are infernal to a finished IC (also referred to as a "packaged chip"). A packaged chip includes internal components that are fabricated from separate wafers and interconnected at the package level. For example, the internal components may include multiple dies assembled on a flexible printed circuit board and arranged in a flip-chip configuration. Such arrangements are often referred to as a System in Package (SiP). Examples of packaged chips include systems on a chip (SOCs) and application-specific ICs (ASICS).

Figure 1A:
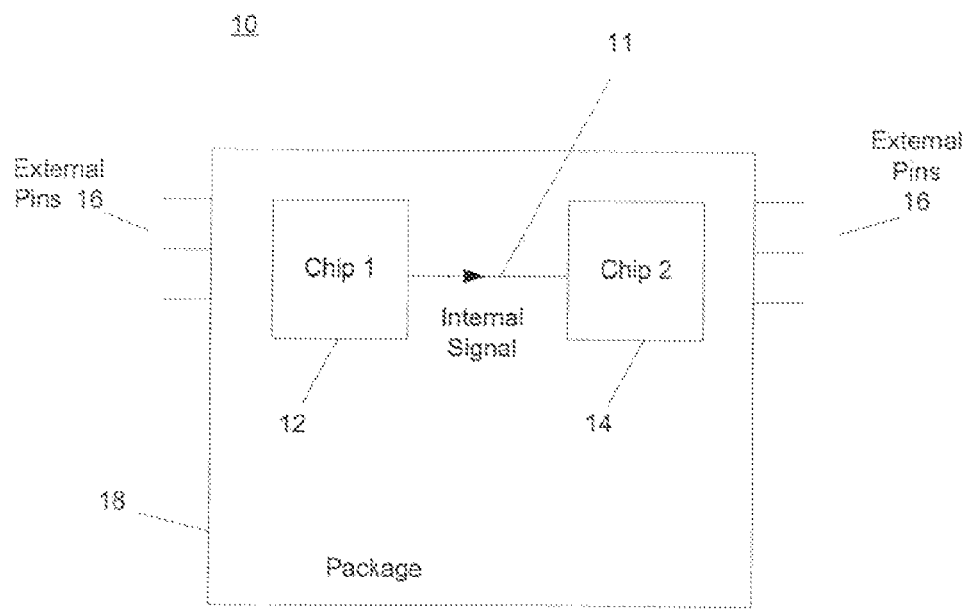
FIGS. 1A and 1B are block diagrams of a device under test (DUT).

FIG. 1A shows a block diagram of a packaged chip 10 that includes a first internal chip 12 and a second internal chip 14 inside a package 18. The infernal chips 12 and 14 are fabricated as two different dies cut either from the same water or from different wafers. If the dies come from the same wafer, they can be integrated into one single chip. Usually multi-chips are from different wafers because they may be fabricated with different processes. In some embodiments, the internal chips 12 and 14 are mounted to a flexible circuit board. One or both of the chips 12 and 14 may include sensitive passive components like inductors, capacitors, quartz crystal, and surface acoustic-wave (SAW) filters. The package 18 of the packaged chip 10 also includes external pins 16 which include input pins for receiving external input signals and output pins for delivering output signals to one or more external devices (not shown) daring normal operation of the packaged chip 10. An internal electrical connection 11 between the internal chips 12 and 14 provides a pathway along which an internal signal propagates between the internal chips 12 and 14. In this example, the internal connection 11 is not accessible to the outside of the packaged chip 10 from any of the external pins 16. As described below, a direct connection to the internal connection 11 could compromise the performance of the signal delivery.

Although some insight as to whether or not the packaged chip 10 is performing correctly can be gained by observing the signals generated at the external pins 16, it is often more useful, and in some cases, necessary to measure signals that are internal to the package, e.g., signals propagating between the internal chips 12 and 14 via the internal connection 11. Gaming access to internal signals is often difficult, e.g., due to the packaging.

Figure 1B:
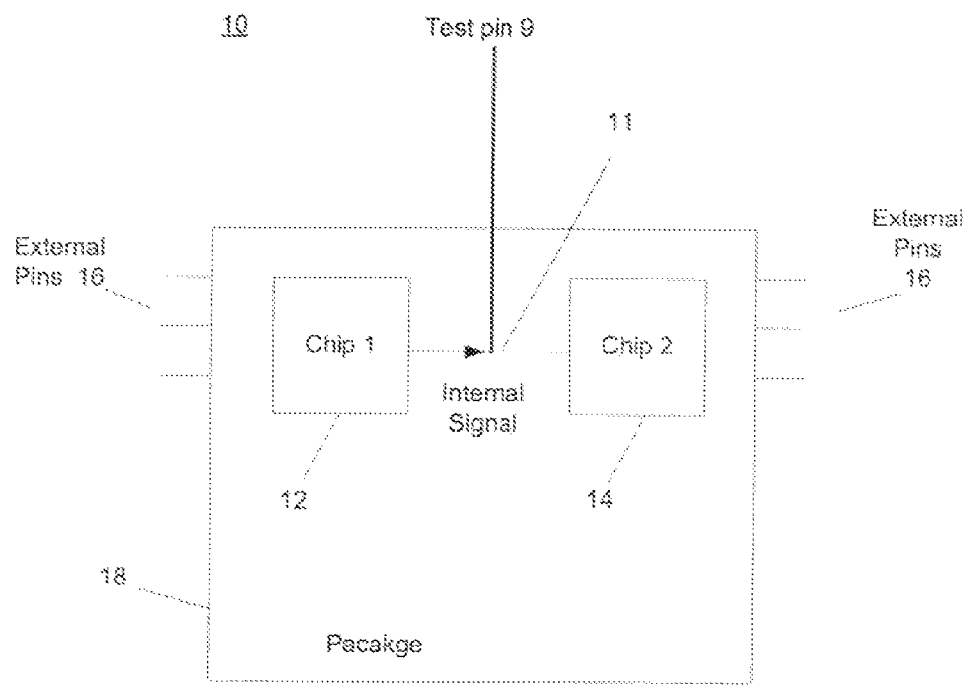

FIG. 1B shows the packaged chip 10 of FIG. 1A with a test pin 9 connected to the internal connection 11. Although it is possible, during manufacture, to include the test pin 9 in the package 18 to provide a connection to a site inside the packaged chip 10 from the outside to enable the measurement of internal signals, during normal operation, the test pin 9 can create interfering reflections, imperfections, and undesired responses, especially during operation at high frequencies. Another problem that arises with the test pin 9 is that when a test instrument is connected to the pin, the test instrument adds extra load to the device that would not be present under normal operation. The additional load can affect the signals received at the test instrument and skew the test results.

In some testing schemes, internal chips are tested separately and are verified to function properly before being assembled into a packaged chip. These types of testing schemes are commonly referred to as "known-good die" test because an internal chip that has passed tests is referred to as a "known-good die." Even if an internal chip has been verified to be a known-good die, it could be damaged or destroyed during subsequent manufacturing/assembly processes (e.g., grinding processes) before being assembled into a package. During such processes, the dies may sustain physical or electrical damage that causes them to function improperly. For example, at least a portion of the die may be over-heated, and/or electrical connections could be disconnected or shorted. Even if all of the components of a packaged chip have been verified to function properly during a known-good die testing procedure, after assembly, the packaged chip may be defective.

As described in further detail below, to address the shortcomings of at least some of the foregoing testing techniques, a DFT probe makes it possible to directly analyze internal signals (e.g., signals between internal chips) while maintaining the integrity of signals within the packaged chip during testing and normal operation.

Figure 2A:
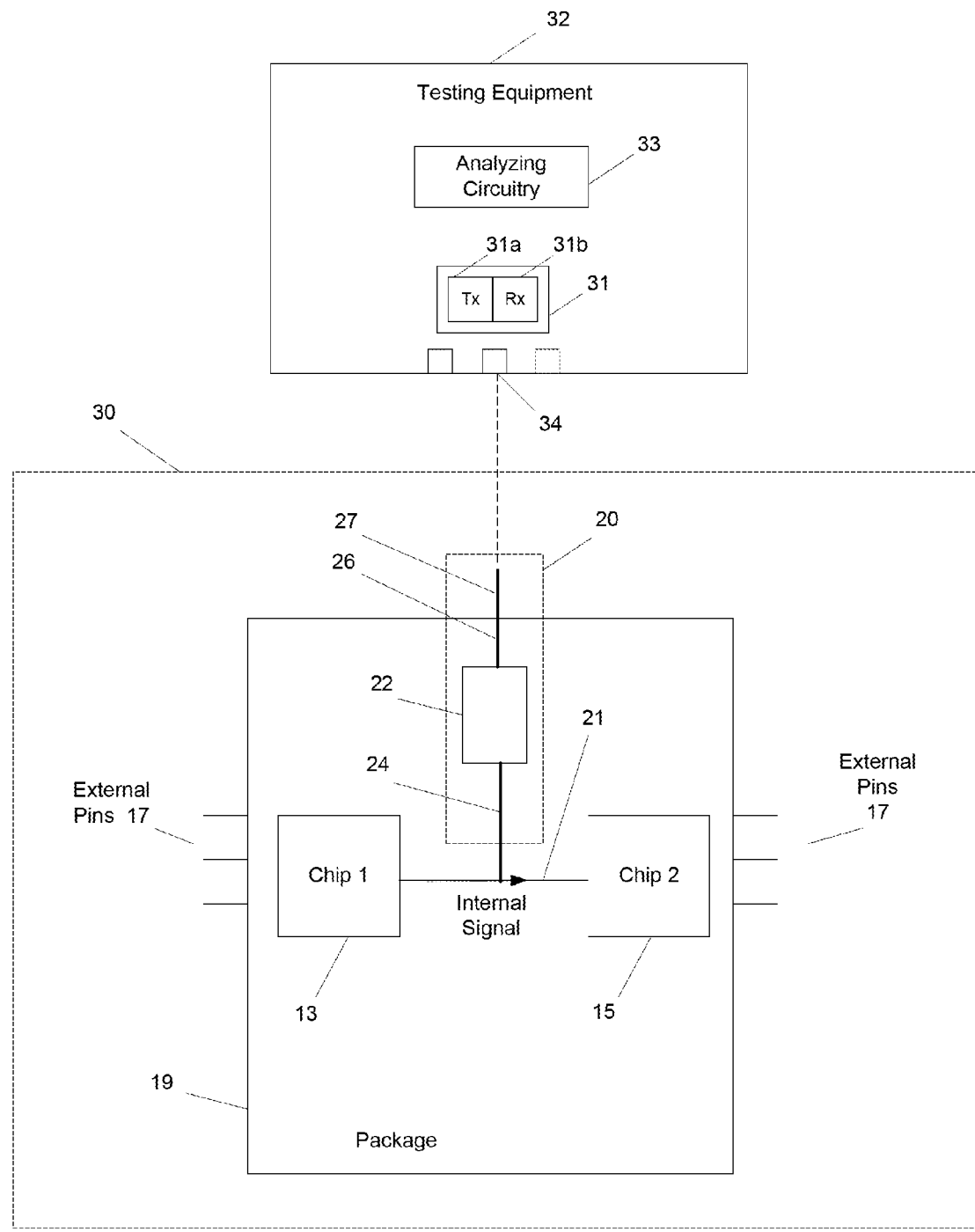
FIGS. 2A and 2B are block diagrams of other DUTs.

Referring to FIG. 2A, a packaged chip 30 is configured to enable testing at one or more of its internal sites. The packaged chip 30 includes a first internal chip 13 and a second internal chip 15 assembled inside a package 19. For example, the package 19 may be a flip chip package in which the first and second chips 13 and 15 are mounted to a flexible circuit board. The package 19 of the packaged chip 30 includes external pins 17 which include input pins for receiving external input signals and output pins for delivering output signals to one or more external devices (not shown) during normal operation of the packaged chip 30.

The first and second internal chips 13 and 15 are fabricated as two different dies cut either from the same wafer or from different wafers. In some embodiments, the first internal chip 13 may be a signal transmitter and the second internal chip 15 may be a signal receiver. One or both, of the first and second chips 13 arid 15 may be integrated circuits and/or include electrically sensitive components such as quartz crystal and SAW filters. The packaged chip 30 also includes a DFT probe 20 electronically coupled to an internal signal pathway 21 over which an internal signal propagates between the first and second internal chips 13 and 15. The internal signal pathway 21 may include one or more wires and other components (e.g., resistors, capacitors, etc) for delivering internal signals between the first and second internal chips 13 and 15.

The DFT probe 20 provides a connection from the inside of the package 19, at a site of the internal signal pathway 21, to the outside of the package 19. The DFT probe includes a resistive component 22 coupled to first and second conductive components 24 and 26 (e.g., wires). The first conductive component 24 is in electronic communication with the signal pathway 21. For example, the first conductive component 24 may be a wire soldered to a site on the signal pathway 21. The second conductive component 26 is electrically coupled to the resistive component 22 and includes an external test pin 27 for providing access to interconnects (e.g., wires) within the package 19. For example, the second conductive component 26 may be a wire that is connected to the resistive component 22 and that extends through an outer casing of the package 19 to form the test pin 27.

The test pin 27 is configured to be attached to external test equipment 32, which may include one or more of: automatic test equipment, oscilloscopes, spectrum analyzers, logic analyzers, noise analyzers, multimeters, and other electronic test equipment. The test equipment 32 has a contact 34, such as a probe, that can be connected to the test pin 27. Through the test pin 27, the test equipment 32 receives internal signals propagating along the signal pathway 21 and delivers test signals to various internal components (e.g., internal chips 13 and 15) that are in electrical communication with the signal pathway 21. The test equipment 32 includes circuitry 31 to exchange signals with the internal components of the packaged chip 30. The circuitry 31 includes transmit (Tx) circuitry 31a for delivering the test signals and receive (Rx) circuitry 31b for receiving the internal signals. The test equipment 32 also includes circuitry 33 for analyzing signals received from the DFT probe 20. The DFT probe 20 is used to look at various internal signals, including inter-package signals (e.g., signals that are transmitted between components within the package that were fabricated in separate dies). For example, in embodiments in which the internal chips 13 and 15 come from separate dies, the signals propagating along the signal pathway 21 are inter-package signals. The DFT probe 20 is also used to introduce signals into the packaged chip 30.

The resistive component 22 has an impedance for substantially isolating the load of the test equipment 32 from internal components (e.g., internal chips 13 and 15) during testing. As a result, the DFT probe 20 enables the test equipment 32 to measure internal signals without the impedance of the test equipment 32 affecting the internal signals to any significant, degree. In other words, the desired information can be obtained from the internal signals measured at the test equipment 32. The resistive component 22 also substantially isolates the infernal components of the packaged chip 30 from the second conductive component 26, including pin 27, so that during normal operation, any signals propagating through the conductive component 26 will have little to no effect on the operation of the internal components. For example, substantial isolation may be achieved when the conductive resistive component 22 attenuates signals propagating through the second conductive component 26 such that the internal components of the packaged chip 30 operate as intended.

The impedance of the resistive component 22 is generally greater than a hundred ohms. For example, the impedance may be in the range of several hundred ohms to several thousand ohms. The resistive component 22 may be a passive device, for example, a single resistor, voltage divider, or a combination of resistors, capacitors, and other passive electrical components. The resistive component 22 may also be a transistor-implemented buffer (e.g., an emitter follower) or a combination of transistor-implemented buffers which may also include passive components. The DFT probe 20 may be integrated into the packaged chip 30 during the manufacturing phase.

Figure 2B:
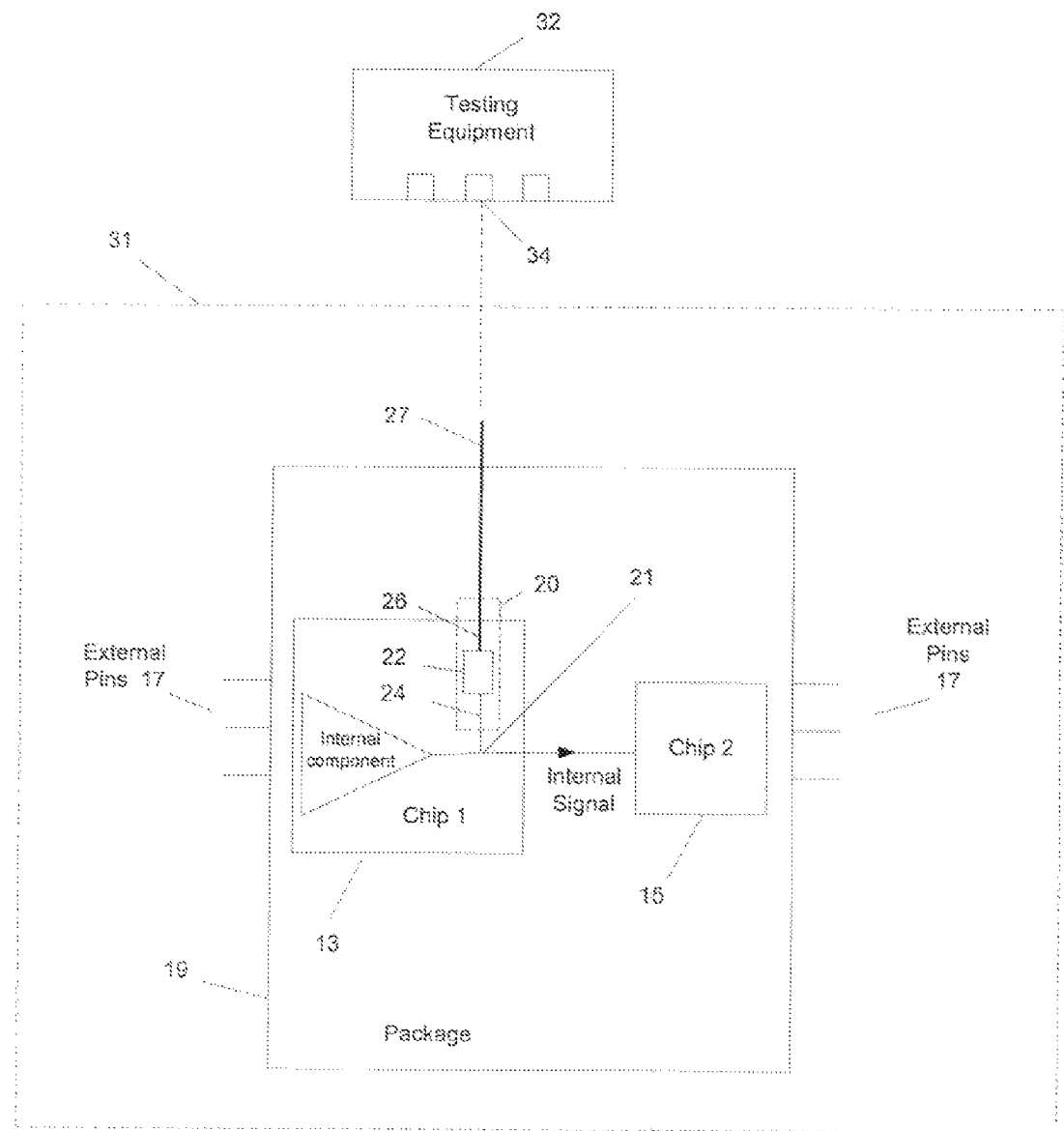

FIG. 2B shows a packaged chip 31 that is identical to the packaged chip 30 of FIG. 2A, except that the resistive component 22 is located inside the internal chip 13. The resistive component 22 may be designed and fabricated inside the silicon of one of the internal chips 13 and 15. For example, the resistive component 22 of FIG. 2B could be a transistor-implemented buffer or a combination of transistor-implemented buffers which may also include passive components. In other embodiments, the resistive component 22 is fabricated on a separate piece of silicon and later attached to an interconnect between the internal chips 13 and 15. For example, the resistive component 22 may be attached to a flexible circuit board to which the internal chips 13 and 15 are attached.

Figure 3:
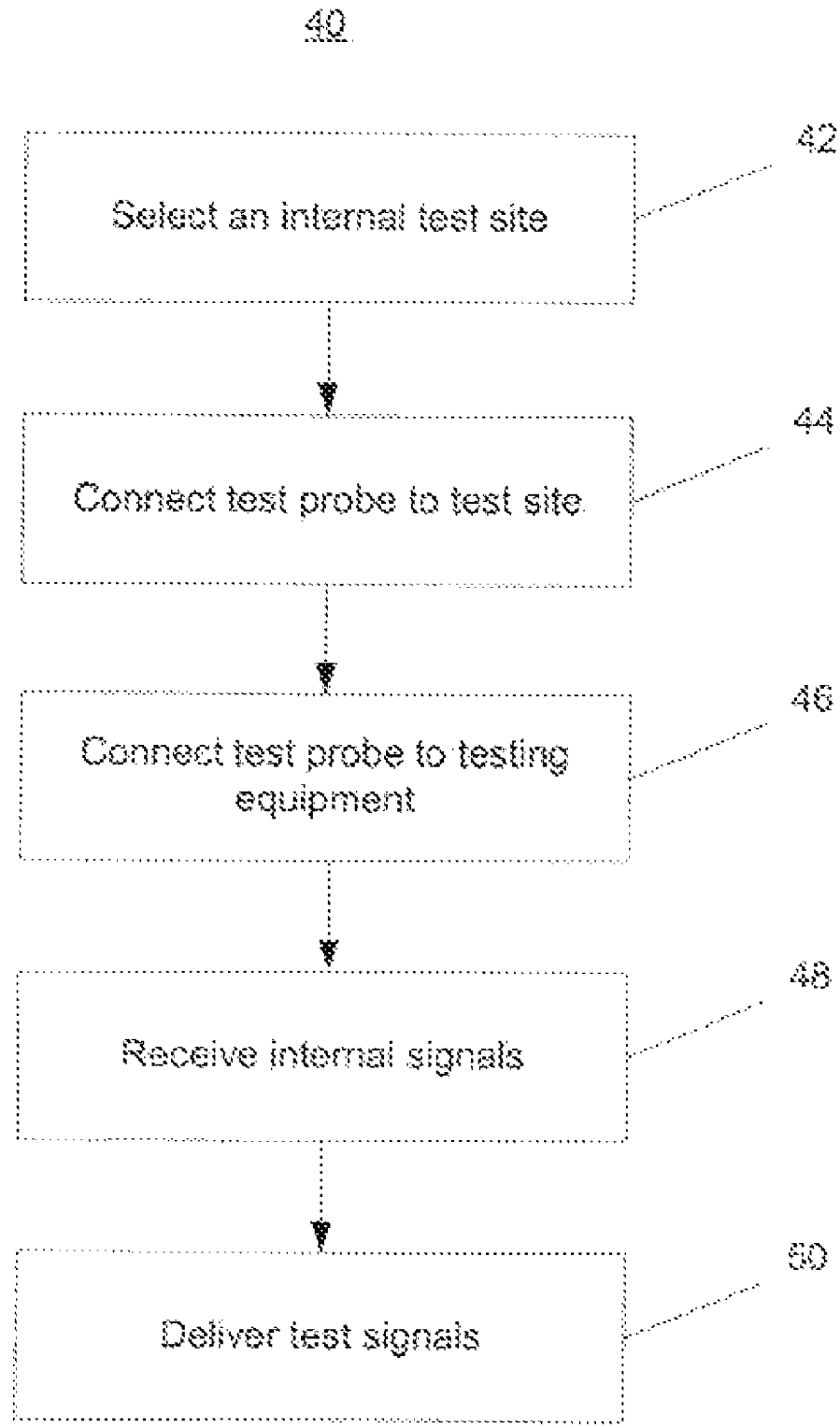
FIG. 3 is a flowchart of a process for testing the DUTs of FIGS. 2A and 2B.

Referring to FIG. 3, a process 40 for fabricating and testing a packaged chip, such as the packaged chip 30 shown in FIG. 2, is described. During manufacture, an internal test site is selected (42). For example, the internal test site may be a site along a signal pathway between multiple internal components (e.g., the signal pathway 21 between internal chips 12 and 15). A DFT probe (e.g., DFT probe 20 of FIG. 2) is connected (44) to the internal test site. In some embodiments, a conductor of the DFT probe is soldered to the test site. In other embodiments, the internal test site is selected during a design phase and the DFT probe is fabricated within one of the internal components. The DFT probe is connected (46) to test equipment 32 at the contact 34. From the DFT probe, the test equipment 32 receives (48) signals propagating through the internal test site and analyzes the signals to verify whether one or more internal components of the packaged chip are functioning properly. Through the DFT probe, the test equipment 32 can also deliver (50) test signals to the packaged chip at the internal test site. In some embodiments, multiple DFT probes are integrated into a packaged chip at various internal test sites. In these embodiments, a first portion of the DFT probes may be used to deliver internal signals from the internal test sites to the test equipment 32 and a second portion of the DFT probes may he used to deliver test signals from the test equipment 32 to the internal test sites. For example, the test equipment 32 may deliver a test signal to a first internal site using a first DFT probe and monitor a signal generated at a second test she in response to the test signal using a second DFT probe.

The process 40 and the test equipment 32 are not limited to use with the hardware and software described herein. The process 40 and the test equipment 32 can be implemented in digital electronic circuitry, or in computer hardware, firmware, software, or in combinations thereof, e.g., software may he used to control the sending and receiving of test signals and placement of the DFT probe.

The process 40 and the test equipment 32 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the process 40 and the test equipment 32 can be performed by one or more programmable processors executing one or more computer programs to perform, the functions of the processes. All or part of the process 40 and the test equipment 32 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

A number of embodiments have been described. Nevertheless, it should be understood that various modifications may be made. For example, the packaged chip 30 of FIG. 2 could be manufactured to include multiple DFT probes electrically coupled to multiple internal test sites. The internal signal pathway 21 could be any communication pathway including a wire, a bus, etc. Accordingly, other embodiments, including those not specifically described herein, are within the scope of the following claims.

What is claimed is:

1. A packaged integrated circuit comprising:
   first and second chips having external pins that are accessible from outside the packaged integrated circuit;
   an electrical connection between the first and second chips, the electrical connection providing a communication pathway along which an internal signal propagates between the first chip and the second chip, the internal signal being inaccessible from an external pin on a package that includes the first and second chips; and
   a probe configured to measure the internal signal, the probe comprising:
      a first conductive portion connected to the communication pathway;
      a second conductive portion configured to be attached to testing equipment; and
      a resistive component coupled to the first and second conductive portions, the resistive component having an impedance to:
         substantially isolate a load of the testing equipment from the electrical connection during testing, the load being communicatively coupled to the test probe; and
         substantially isolate signals propagating through the second conductive portion of the test probe.

2. The packaged integrated circuit of claim 1, wherein the resistive component comprises a resistor.

3. The packaged integrated circuit of claim 1, wherein the resistive component comprises a transistor-implemented buffer.

4. The packaged integrated circuit of claim 1, wherein the second conductive portion is configured to:
   receive a test signal from the testing equipment; and
   deliver the test signal to one or both of the first and second chips.

5. The packaged integrated circuit of claim 1, wherein first and second chips are attached to a flexible printed circuit board.

6. Automatic test equipment for testing a device under test having first and second interconnected chips that are internal to the device under test, the automatic test equipment comprising:
   a test probe; and
   a testing device communicatively coupled to the device under test, the testing device comprising circuitry to exchange signals with the device under test, the signals comprising an internal signal acquired by the test probe attached to a communication pathway between the first and second chips, the internal signal traveling inside the device under test along the communication pathway and being inaccessible from an external pin of the device under test,
   wherein the test probe comprises:
   a first conductive portion connected to the communication pathway;
   a second conductive portion attached to the testing device; and
   a resistive component coupled to the first and second conductive portions, the resistive component having an impedance to:
      substantially isolate a load of the testing device from the device during testing, the load being communicatively coupled to the test probe; and
      substantially isolate signals propagating through the second conductive portion of the test probe.

7. The automatic test equipment of claim 6, wherein the resistive component has an impedance that is greater than 100 ohms.

8. The automatic test equipment of claim 6, further comprising circuitry to analyze signals received from the test probe.

9. The automatic test equipment of claim 6, further comprising a contact configured to be electrically coupled to one of the first and second conductive portions of the test probe.

10. The automatic test equipment of claim 6, wherein the circuitry to exchange signals with the device under test further comprises:
    circuitry for delivering a test signal to the device at the site using the test probe; and
    circuitry for receiving the internal signal from the test probe.

11. The automatic test equipment of claim 6, wherein the device under test is a packaged integrated circuit.

* * * * *